US012628575B2

(12) United States Patent
Cho et al.

(10) Patent No.: US 12,628,575 B2
(45) Date of Patent: May 12, 2026

(54) RESISTIVE SWITCHING MEMORY DEVICE INCLUDING DUAL ACTIVE LAYER AND ARRAY INCLUDING THE SAME

(71) Applicant: Research & Business Foundation Sungkyunkwan University, Suwon (KR)

(72) Inventors: Hyung Koun Cho, Suwon (KR); Dong Su Kim, Yongin (KR); Hee Won Suh, Suwon (KR)

(73) Assignee: RESEARCH & BUSINESS FOUNDATION SUNGKYUNKWAN UNIVERSITY, Suwon (KR)

( * ) Notice: Subject to any disclaimer, the term of this patent is extended or adjusted under 35 U.S.C. 154(b) by 715 days.

(21) Appl. No.: 17/956,288

(22) Filed: Sep. 29, 2022

(65) Prior Publication Data

US 2023/0097791 A1     Mar. 30, 2023

(30) Foreign Application Priority Data

Sep. 29, 2021     (KR) ........................ 10-2021-0128776

(51) Int. Cl.
| | |
|---|---|
| *H10B 63/00* | (2023.01) |
| *G11C 13/00* | (2006.01) |
| *H10N 70/00* | (2023.01) |
| *H10N 70/20* | (2023.01) |

(52) U.S. Cl.
CPC ....... *H10N 70/826* (2023.02); *G11C 13/0004* (2013.01); *H10B 63/82* (2023.02); *H10N 70/021* (2023.02); *H10N 70/231* (2023.02); *H10N 70/8833* (2023.02); *H10N 70/8836* (2023.02); *G11C 13/0007* (2013.01);
(Continued)

(58) Field of Classification Search
CPC .. H10N 70/021; H10N 70/231; H10N 70/826; H10B 63/82; G11C 13/0004
See application file for complete search history.

(56) References Cited

U.S. PATENT DOCUMENTS

| | | | | |
|---|---|---|---|---|
| 2010/0258778 A1* | 10/2010 | Sung | .................... | H10N 70/026 257/43 |
| 2012/0267598 A1* | 10/2012 | Sakotsubo | ........ | H01L 21/02183 257/E47.001 |
| 2013/0270509 A1* | 10/2013 | Hwang | ................ | H10N 70/826 257/4 |

FOREIGN PATENT DOCUMENTS

| | | |
|---|---|---|
| JP | 2011216146 | 10/2011 |
| KR | 20140020636 | 2/2014 |
| KR | 101401221 | 5/2014 |

(Continued)

*Primary Examiner* — Yara B Green
*Assistant Examiner* — Christopher M Roland
(74) *Attorney, Agent, or Firm* — LEX IP MEISTER, PLLC

(57) ABSTRACT

An embodiment of the present disclosure provides a resistive switching memory device including: a lower electrode; an amorphous metal oxide-based first active layer positioned on the lower electrode; an amorphous metal oxide-based second active layer positioned on the first active layer; and an upper electrode positioned on the second active layer, wherein the first active layer and the second active layer are made of the same substance but are different in electrical characteristic, thereby having a voluntary compliance current characteristic and a voluntary current rectification characteristic as a single device having a stable electrical characteristic, a method of manufacturing the resistive switching memory device, and an array including the resistive switching memory device.

10 Claims, 10 Drawing Sheets

(52) U.S. Cl.
CPC ...... *G11C 2213/15* (2013.01); *G11C 2213/73*
(2013.01); *G11C 2213/77* (2013.01)

(56) References Cited

FOREIGN PATENT DOCUMENTS

| KR | 20190119545 | 10/2019 | |
| KR | 20210014856 | 2/2021 | |
| KR | 20210050015 A * | 5/2021 | ......... H01L 45/1253 |

* cited by examiner (a)

(b)

(a)

(b)

(a)

- Multi-level @LRS1 and @LRS2     Memory density↑

(b)

- Self-rectifying @LRS and @HRS     Self-
- Self-compliant @LRS     driving

RESISTIVE SWITCHING MEMORY DEVICE INCLUDING DUAL ACTIVE LAYER AND ARRAY INCLUDING THE SAME

BACKGROUND OF THE INVENTION

Field of the Invention

The present disclosure relates to a resistive switching memory device and, more particularly, a resistive switching memory (RRAM) that can achieve a voluntary rectification characteristic, a voluntary limit current characteristic, and a multi-level implementation by including amorphous metal oxide-based dual active layers made of the same material.

Description of the Related Art

As high-density integration of volatile memories comes close to a limit, a nonvolatile memory rises as a next generation memory.

A nonvolatile memory includes a phase change RAM (PRAM), a nano-floating gate memory (NFGM), a resistive RAM (ReRAM), a polymer RAM (PoRAM), a magnetic RAM (MRAM), molecule electronics, etc., and a RRAM (resistive RAM) of these devices is spotlighted as a next generation nonvolatile memory because of an easy manufacturing process, a high switching speed, and excellent durability in comparison to other devices.

According to the technical development trend of the RRAM (Resistive RAM), a technology of achieving a cross point array using an RRAM is being developed as a strategy for further increasing integration of the RRAM.

The cross point array using an RRAM in the early stage had some problems. First, there is influence (cross-talk) between adjacent cells when a cross point array using an RRAM is formed, thereby forming a sneak path and generating backflow of a current (sneak current), so there was a problem that data errors are generated. Further, there was a problem that it is required to suppress a current that is irreversibly generated when an RRAM is driven.

In order to solve these problems, an external selection device and an external compliance current application device were applied to the existing cross point array using an RRAM, but it was impossible to use a simple metal-insulator-metal (MIM) structure, which is an advantage of the RRAM, and there was a limitation in integration.

Second, a compliance current that controls conductivity is necessarily required to drive an RRAM. A current was limited in existing RRAMs using an external diode, a transistor, etc., but it was accompanied by a limitation in integration of the memory. Further, the added external diode, transistor, etc. could not follow the processing speed of an RRAM active layer, so there was a problem that the driving speed of the memory is limited.

As another technical trend, a method of manufacturing an RRAM itself into a single device having functions not requiring help of an external diode, a transistor, etc. was proposed, and a structure including active layers made of different substances in dual layers was developed. However, it was difficult to uniformly control the number and size of polycrystalline grain boundaries, so electrical non-uniformity and instability of a device turned out as insuperable problems.

Similarly, an RRAM using a phase change needs a heat transmit layer, so there was a difficulty in performing a complicated process.

It was attempted to solve these problems by disclosing a resistance memory device including a lower electrode formed on a substrate, a variable resistive layer disposed on the lower electrode, and an upper electrode formed on the variable resistive layer, in which the variable resistive layer is composed of two or more oxide films, and a method of manufacturing the resistance memory device in Korean Patent No. 10-1401221 (titled, "Resistance memory device comprising crystalline oxidation film and method of fabricating the same"). However, since a crystalline oxidation film is included, it is difficult to control the number and size of grain boundaries and accordingly there is a limitation of electrical non-uniformity and instability of the device.

Accordingly, there is a need for a technology that can achieve a multi-level implementation as a single device to keep the advantages of an RRAM and increase integration and that can solve the problem of a sneak current that is generated when forming an array and the problem that it is required to control a compliance current.

CITATION LIST

Patent Literature

Patent Literature 1: Korean Patent No. 10-1401221

SUMMARY OF THE INVENTION

An objective of the present disclosure for solving the problems described above is to provide a resistive switching memory device (RRAM) that can achieve a multi-level implementation as a single device.

Another objective of the present disclosure is to provide a resistive switching memory device (RRAM) that solves the problem of a sneak current that is generated between adjacent cells when a cross point array is formed, and solves the problem that it is required to control a compliance current, as a single device.

Another objective of the present disclosure is to provide a resistive switching memory device that solves the problem of controlling grain boundaries that is generated when an active layer is formed into a crystalline dual layer, and solves the corresponding problem of electrical non-uniformity and instability of a device.

The objectives to implement in the present disclosure are not limited to the technical problems described above and other objects that are not stated herein will be clearly understood by those skilled in the art from the following specifications.

In order to achieve the objectives, a resistive switching memory device that is an embodiment of the present disclosure includes: a lower electrode; an amorphous metal oxide-based first active layer positioned on the lower electrode; an amorphous metal oxide-based second active layer positioned on the first active layer; and an upper electrode positioned on the second active layer, wherein the first active layer and the second active layer are made of the same substance and are different in electrical characteristic, In an embodiment of the present disclosure, the amorphous metal oxide-based first active layer may include crystalline metal oxide nanoparticles.

In an embodiment of the present disclosure, the amorphous metal oxide-based second active layer may include crystalline metal oxide nanoparticles.

In an embodiment of the present disclosure, the first active layer and the second active layer may be different in set driving voltage.

In an embodiment of the present disclosure, the first active layer and the second active layer may be the same in reset driving voltage.

In an embodiment of the present disclosure, the first active layer or the second active layer may show a voluntary rectification characteristic.

In an embodiment of the present disclosure, the first active layer and the second active layer may include one or more selected from a group composed of $CuO$, $CuzO$, $Al_2O_3$, $Nb_2O_5$, $NiO$, $MgO$, $TiO_2$, $ZrO_2$, $Nb:SrTiO_3$, $Cr:SrTiO_3$, $Cr:SrZrO_3$, $ZnO$, $Co_3O_4$, $Fe_2O_3$, $Ag_2O_3$, $Bi_2O_3$, $Sb_2O_3$, $PbO_2$, $RuO_2$, $MnO_2$, $Cr_2O_3$, and a combination thereof.

The resistive switching memory device that is an embodiment of the present disclosure may show: (a) a first resistance state in which a first positive voltage is applied between the upper electrode and the lower electrode, so the first active layer is set into a low-resistance state; (b) a second resistance state in which a second positive voltage is applied between the upper electrode and the lower electrode, so the first active layer and the second active layer are set into a low-resistance state; and (c) a third resistance state in which a third positive voltage is applied between the upper electrode and the lower electrode, so the first active layer and the second active layer are reset into a high-resistance state.

In order to achieve the objectives, a method of manufacturing a resistive switching memory device that is another embodiment of the present disclosure includes: (i) forming an amorphous metal oxide-based first active layer on a lower electrode by electrochemical deposition; (ii) forming an amorphous metal oxide-based second active layer on the first active layer by electrochemical deposition; and (iii) forming an upper electrode on the second active layer, in which the first active layer and the second active layer are made of the same substance but process conditions of the electrochemical deposition are different.

In an embodiment of the present disclosure, the amorphous metal oxide-based first active layer may include crystalline metal oxide nanoparticles.

In an embodiment of the present disclosure, the amorphous metal oxide-based second active layer may include crystalline metal oxide nanoparticles.

In an embodiment of the present disclosure, the metal oxides of the step (i) and the step (ii) may include one or more selected from a group composed of $CuO$, $Cu_2O$, $Al_2O_3$, $Nb_2O_5$, $NiO$, $MgO$, $TiO_2$, $ZrO_2$, $Nb:SrTiO_3$, $Cr:SrTiO_3$, $Cr:SrZrO_3$, $ZnO$, $CoSO_4$, $Fe_2O_3$, $AgzO_3$, $Bi_2O_3$, $Sb_2O_3$, $PbO_2$, $RuO_2$, $MnO_2$, $Cr_2O_3$, and a combination thereof.

In order to achieve the objectives, a resistive switching memory device array that is another embodiment of the present disclosure includes: a first electrode extending in a first direction; a second electrode extending in a second direction crossing the first electrode; and an amorphous metal oxide-based first active layer and an amorphous metal oxide-based second active layer sequentially formed between the first electrode and the second electrode, in which the first active layer and the second active layer are made of the same substance but are different in electrical characteristic.

In an embodiment of the present disclosure, the amorphous metal oxide-based first active layer may include crystalline metal oxide nanoparticles.

In an embodiment of the present disclosure, the amorphous metal oxide-based second active layer may include crystalline metal oxide nanoparticles.

In an embodiment of the present disclosure, the first active layer and the second active layer may include one or more selected from a group composed of $CuO$, $Cu_2O$, $Al_2O_3$, $Nb_2O_5$, $NiO$, $MgO$, $TiO_2$, $ZrO_2$, $Nb:SrTiO_3$, $Cr:SrTiO_3$, $Cr:SrZrO_3$, $ZnO$, $Co_3O_4$, $Fe_2O_3$, $Ag_2O_3$, $Bi_2O_3$, $Sb_2O_3$, $PbO_2$, $RuO_2$, $MnO_2$, $Cr_2O_3$, and a combination thereof.

DETAILED DESCRIPTION OF THE PREFERRED EMBODIMENTS

Figure 1:
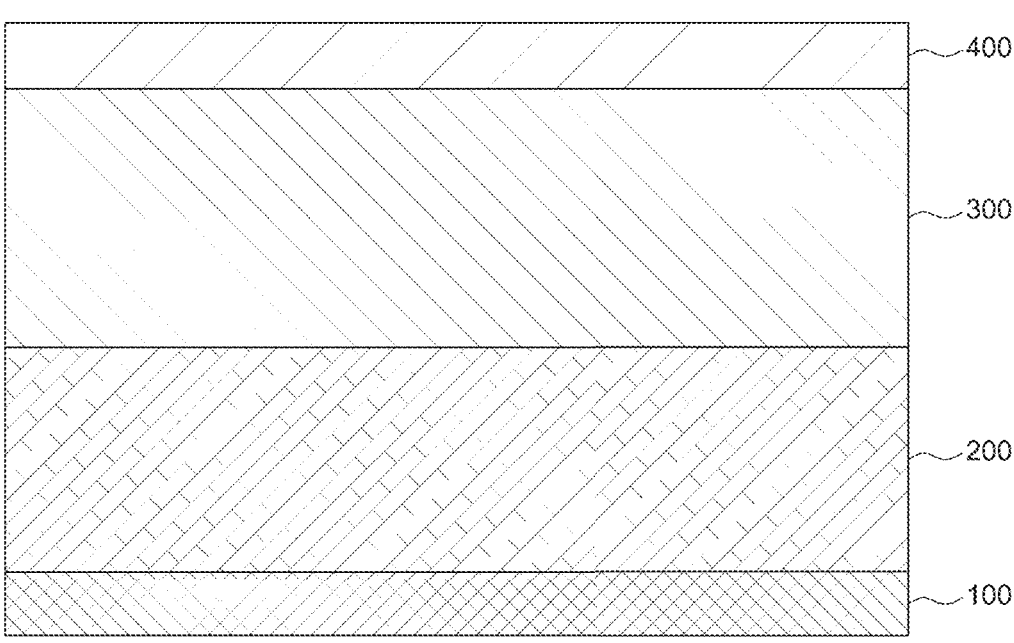
FIG. 1 a cross-sectional view schematically showing a resistive switching memory device that is an embodiment of the present disclosure.

Hereinafter, the present disclosure is described with reference to the accompanying drawings. However, the present disclosure may be modified in various different ways and is not limited to the embodiments described herein. Further, in the accompanying drawings, components irrelevant to the description will be omitted in order to obviously describe the present disclosure, and similar reference numerals will be used to describe similar components throughout the specification.

Throughout the specification, when an element is referred to as being "connected to (coupled to, combined with, in contact with)" another element, it may be "directly connected" to the other element and may also be "indirectly connected" to the other element with another element intervening therebetween. Further, unless explicitly described otherwise, "comprising" any components will be understood to imply the inclusion of other components rather than the exclusion of any other components.

Terms used in the present invention are used only in order to describe specific exemplary embodiments rather than limiting the present disclosure. Singular forms are intended to include plural forms unless the context clearly indicates otherwise. It will be further understood that the terms "comprises" or "have" used in this specification specify the presence of stated features, numerals, steps, operations, components, parts, or a combination thereof, but do not preclude the presence or addition of one or more other features, numerals, steps, operations, components, parts, or a combination thereof.

Hereinafter, embodiments of the present disclosure are described in detail with reference to the accompanying drawings.

FIG. 1 a cross-sectional view schematically showing a resistive switching memory device that is an embodiment of the present disclosure.

Referring to FIG. 1, a resistive switching memory device that is an embodiment of the present disclosure includes: a lower electrode 100, an amorphous metal oxide-based first active layer 200 positioned on the lower electrode 100; an amorphous metal oxide-based second active layer 300 positioned on the first active layer 200; and an upper electrode 400 positioned on the second active layer 300.

The first active layer 200 and the second active layer 300 are characterized by being made of the same substance but having different electrical characteristics.

In an embodiment of the present disclosure, the upper electrode 400 and the lower electrode 100 are provided to apply a voltage to the first active layer 200 and the second active layer 300 and are made of metal or an oxide having electrical conductivity. In detail, the electrodes may include conductive oxides such as ITO(InSnO), IZO(InZnO), and AZO(AlZnO) or metals such as Ir, Pt, Ru, Au, Ag, Mo, Al, W, and Cu.

In an embodiment of the present disclosure, the first active layer 200 may be positioned on the lower electrode 100.

The first active layer 200 may include a metal oxide that can be used to form a thin film by electrochemical deposition. In detail, all metal oxides produced by bonding of hydroxyl ions and metal ions by electrochemical deposition correspond to the metal oxide described above.

For example, the metal oxide described above may include one or more selected from a group composed of $CuO$, $Cu_2O$, $Al_2O_3$, $Nb_2OS$, $NiO$, $MgO$, $TiO_2$, $ZrO_2$, $Nb:Sr-TiO_3$, $Cr:SrTiO_3$, $Cr:SrZrO_3$, $ZnO$, $CosO_4$, $Fe_2O_3$, $AgzO_3$, $Bi_2O_3$, $Sb_2O_3$, $PbO_2$, $RuO_2$, $MnO_2$, $Cr_2O_3$, and a combination thereof.

The first active layer 200 is characterized by being amorphous. In detail, the first active layer 200 may be a type in which crystalline metal oxide nanoparticles are distributed in a matrix that is an amorphous metal oxide.

When a matrix itself is crystalline, it has a forming voltage, but when a matrix is an amorphous, it shows a forming-free behavior, so there is an advantage. However, when a matrix is an amorphous, there is a problem of low electrical conductivity, which is possible to resolved by distributing crystalline metal oxide nanoparticles having high electrical conductivity in an amorphous matrix.

In detail, when a voltage is applied to an RRAM device, the RRAM device changes into a low resistance state (LRS) from a high resistance state (HRS), and the forming voltage means a voltage that is required to form a conductive path for progressing this process.

In this case, in a crystalline structure in which grains and grain boundaries are clearly discriminated, the grain boundary density is not uniform in the path in which a conductive path is formed and it is difficult to form a shortest conductive path.

Accordingly, when all of first active layers 200 are crystalline, a memory device has irregular forming driving and high forming voltage when the memory device is driven.

On the contrary, when they are amorphous, the structure is dense and grain boundaries are very small, so the grain boundary density of a path where a conductive path is formed is relatively uniform. Accordingly, it is stable in formation of a conductive path and has a forming-free driving characteristic.

Next, crystalline metal oxide nanoparticles distributed in the amorphous matrix serve to form a channel when a voltage is applied. In particular, nano-level crystalline particles do not generate a grain boundary problem, which is defect that a bulk crystalline structure has, and solves the problem of low electrical conductivity of an amorphous matrix because the electrical conductivity thereof is high.

In this case, it is possible to adjust the electrical conductivity of an active layer by adjusting the size and density of crystalline metal oxide nanoparticles distributed in the amorphous matrix.

For the mechanism described above, the amorphous first active layer 200 proposed in the present disclosure has an advantage that it is possible to drive a memory device with a stable electrical characteristic and a low voltage, and satisfies a condition under which it is possible to form a plurality of active layers made of the same substance and being different in electrical characteristic.

Next, in an embodiment of the present disclosure, the second active layer 300 may be positioned on the first active layer 200.

The second active layer 300 may include a metal oxide that can be used to form a thin film by electrochemical deposition. In detail, all metal oxides produced by bonding of hydroxyl ions and metal ions by electrochemical deposition correspond to the metal oxide described above.

For example, the metal oxide described above may include one or more selected from a group composed of $CuO$, $Cu_2O$, $Al_2O_3$, $Nb_2OS$, $NiO$, $MgO$, $TiO_2$, $ZrO_2$, $Nb:Sr-TiO_3$, $Cr:SrTiO_3$, $Cr:SrZrO_3$, $ZnO$, $CosO_4$, $Fe_2O_3$, $AgzO_3$, $Bi_2O_3$, $Sb_2O_3$, $PbO_2$, $RuO_2$, $MnO_2$, $Cr_2O_3$, and a combination thereof.

The second active layer 300 is characterized by being amorphous. In detail, the second active layer 300 may be a type in which crystalline metal oxide nano particles are distributed in a matrix that is an amorphous metal oxide.

Similar to the first active layer 200, when all of second active layers 300 are crystalline, the density of grain boundaries in the active layers is not uniform, so when a memory device is driven, irregular forming driving and a high forming voltage are caused. Accordingly, they are based on an amorphous matrix showing a forming-free behavior, which is for solving the problem of low electrical conductivity of an amorphous matrix using crystalline metal oxide nanoparticles distributed in a matrix.

For the mechanism described above, the amorphous second active layer 300 proposed in the present disclosure has an advantage that it is possible to drive a memory device with a stable electrical characteristic and a low voltage, and satisfies a condition under which it is possible to form a plurality of active layers made of the same substance and being different in electrical characteristic.

Next, in an embodiment of the present disclosure, the first active layer 200 and the second active layer 300 are characterized by being made of the same substance but having different electrical characteristics.

In order to achieve the effects of the present disclosure, a single memory device should have a voluntary compliance current characteristic, a voluntary current rectification characteristic, and a voluntary multi-level storage characteristic. In order to secure these characteristics, electrical characteristics should be different between dual active layers, there should be no forming step between layers, and a driving voltage forming mechanism and a filament forming mechanism should be the same, so the single memory device should have a compatible characteristic.

As for factors other than the forming voltage described above, as proposed in the present disclosure, when the active layers described above are made of the same metal oxide, the properties of the metal oxides are the same, so the driving voltage mechanisms are the same and the filament forming mechanisms are the same. Accordingly, the active layers have a compatible characteristic.

However, an electrical characteristic may be different even if the same substance is used when different voltage conditions is used for forming an active layer by electrochemical deposition.

In detail, since the degree of reduction-oxidation for production and growth of a crystal depends on a voltage that is applied in an electrochemical deposition process, the aspect of crystal growth changes, as in Experiment example 1.

Accordingly, the size and density of crystalline metal oxide nanoparticles distributed in an amorphous matrix change, the ratio of the amorphous matrix and the crystalline metal oxide nanoparticles changes, and the electrical characteristic of a thin film changes due to a difference of vacancy density of metal constituting an active layer.

As a result, the single element that is a purpose of the present disclosure satisfies the condition for securing a voluntary compliance current characteristic, a voluntary current rectification characteristic, and a voluntary multi-level storage characteristic.

For this reason, the electrical conductivity is different and a charge carrier density is different between the first active layer 200 and the second active layer 300, so a set driving voltage is different. However, since the substances are the same, a reset driving voltage is the same or has a similar range.

Further, the first active layer 200 or the second active layer 300 can show a voluntary rectification characteristic, depending on the arrangement and the voltage that is applied. Referring to (b) of FIG. 10, it can be seen that a limit current is formed in accordance with a set driving voltage at a forward bias, but a rectification characteristic is shown at a reverse bias.

The rectification characteristic prevents backflow of a current in a single polarity-driven resistive switching memory device, so it is possible to solve the problem of cross-talk that is generated between adjacent cells when a cross point array is formed.

As a result, the resistive switching memory device (RRAM) of the present disclosure solves the problem that is generated when a cross point array is formed even without help of an external device, so there is an advantage that it is possible to achieve high-integration memory and an accurate data program is possible without an error because there is no cell intervention.

Next, the driving characteristic of the resistive switching memory device of the present disclosure is described.

A set driving voltage difference of the first active layer 200 and the second active layer 300 may cause: (a) a first resistance state in which a first positive voltage is applied between the upper electrode 400 and the lower electrode 100, so the first active layer 200 is set into a low-resistance state; (b) a second resistance state in which a second positive voltage is applied between the upper electrode 400 and the lower electrode 100, so the first active layer 200 and the second active layer 300 are set into a low-resistance state; and (c) a third resistance state in which a third positive voltage is applied between the upper electrode 400 and the lower electrode 100, so the first active layer 200 and the second active layer 300 are reset into a high-resistance state. Accordingly, it is possible to achieve a multi-level using a single device, so it is possible to greatly improve the storage capacity of a memory device while maintaining high integration and high-speed driving characteristics.

In an embodiment of the present disclosure, the active layers may be formed as two or more layers by the mechanism described above.

In detail, it is possible to form a plurality of set voltage values by forming a plurality of layers and varying the voltages at which each layers are formed, and accordingly, the resistive switching memory device that is the present disclosure can show a first resistance state to a third resistance state or more that are achieved by dual active layers. As a result, it is possible to achieve a high-capacity memory using a single device.

Hereafter, a method of manufacturing the resistive switching memory device described above is described with reference to drawings. In the following description, the configuration repeated in the resistive switching memory device described above should be construed in the same manner and repeated description is omitted.

Figure 2:
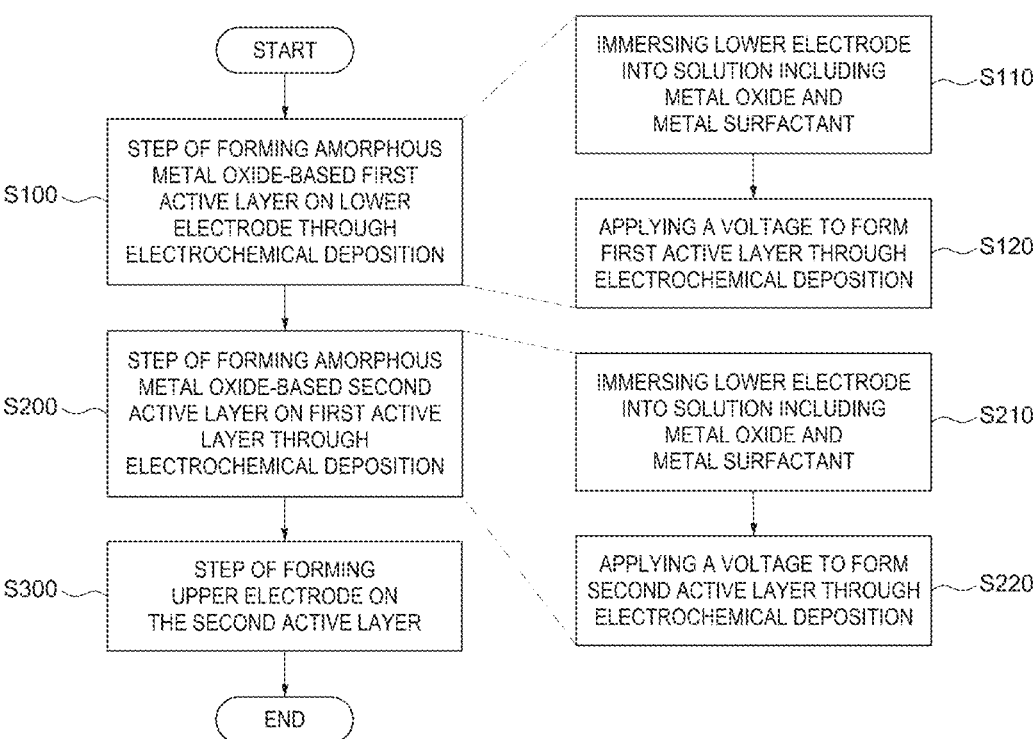
FIG. 2 is a flow chart showing a method of manufacturing the resistive switching memory device that is an embodiment of the present disclosure.

FIG. 2 is a flow chart showing a method of manufacturing the resistive switching memory device that is an embodiment of the present disclosure.

Referring to FIG. 2, a method of manufacturing the resistive switching memory device that is an embodiment of the present disclosure includes: (i) forming an amorphous metal oxide-based first active layer 200 on a lower electrode 100 by electrochemical deposition; (ii) forming an amorphous metal oxide-based second active layer 300 on the first active layer 200 by electrochemical deposition; and (iii) forming an upper electrode 400 on the second active layer 300.

The first active layer 200 and the second active layer 300 are characterized in that they are made of the same substance but the process condition of the electrochemical deposition is different.

The amorphous metal oxide-based first active layer 200 and the amorphous metal oxide-based first active layer 200 may include amorphous metal oxide nanoparticles in an amorphous matrix.

In an embodiment of the present disclosure, the forming of a first active layer 200 in step (i) includes forming the first active layer 200 on the lower electrode 100 by electrochemical deposition.

The electrochemical deposition, in detail, includes: immersing the lower electrode 100 into a solution including a metal oxide and a metal surfactant; and applying a voltage to form the first active layer 200.

The metal oxide in step (i) is a metal oxide that can be used for the electrochemical deposition proposed in the present disclosure, and all metal oxides that are produced by bonding of hydroxyl ions and metal ions may correspond to the metal oxide.

For example, the metal oxide described above may include one or more selected from a group composed of $CuO$, $Cu_2O$, $Al_2O_3$, $Nb_2OS$, $NiO$, $MgO$, $TiO_2$, $ZrO_2$, Nb:Sr-$TiO_3$, Cr:$SrTiO_3$, Cr:$SrZrO_3$, $ZnO$, $CosO_4$, $Fe_2O_3$, $AgzO_3$, $Bi_2O_3$, $Sb_2O_3$, $PbO_2$, $RuO_2$, $MnO_2$, $Cr_2O_3$, and a combination thereof.

The surfactant in step (i) is a substance that can induce electrochemical growth, and may include at least one or more metals of Sb, Ni, Cr, Pb, Co, or Mn, but is not limited thereto.

In an embodiment of the present disclosure, the forming of a second active layer 300 in step (ii) includes forming the second active layer 300 on the first active layer 200 by electrochemical deposition.

The electrochemical deposition, in detail, includes: immersing the lower electrode 100 into a solution including a metal oxide and a metal surfactant; and applying a voltage to form the second active layer 300.

The metal oxide in step (ii) is a metal oxide that can be used for the electrochemical deposition proposed in the present disclosure, and all metal oxides that are produced by bonding of hydroxyl ions and metal ions may correspond to the metal oxide.

For example, the metal oxide described above may include one or more selected from a group composed of $CuO$, $Cu_2O$, $Al_2O_3$, $Nb_2O_5$, $NiO$, $MgO$, $TiO_2$, $ZrO_2$, Nb:Sr-$TiO_3$, Cr:$SrTiO_3$, Cr:$SrZrO_3$, $ZnO$, $Co_3O_4$, $Fe_2O_3$, $Ag_2O_3$, $Bi_2O_3$, $Sb_2O_3$, $PbO_2$, $RuO_2$, $MnO_2$, $Cr_2O_3$, and a combination thereof.

The surfactant in step (ii) is a substance that can induce electrochemical growth, and may include at least one or more metals of Sb, Ni, Cr, Pb, Co, or Mn, but is not limited thereto.

In an embodiment of the present disclosure, the electrochemical deposition in step (i) may be performed under the condition that a voltage of 0.37V is applied, and in this case, the first active layer 200 has the lowest conductivity of thin films having a structure in which crystalline nanoparticles are bonded to an amorphous matrix. The electrochemical deposition in step (ii) may be performed under the condition that a voltage of 0.50V is applied, and in this case, the second active layer 300 has the highest conductivity of thin films having a structure in which crystalline nanoparticles are bonded to an amorphous matrix.

In detail, in the electrochemical deposition, variation of the application voltage affects supply of metal and OH (hydroxyl ion), thereby affecting the ratio of the amorphous matrix and the crystalline nanoparticles of an active layer. In general, when an applied voltage increases, the quantity of metal increases, so conductivity increases.

Accordingly, it is possible to form thin films with different electrical characteristics using the same metal oxide by electrochemical deposition with different application voltages.

Hereafter, a resistive switching memory device array including the resistive switching memory device is described with reference to drawings. In the following description, the configuration repeated in the resistive switching memory device described above should be construed in the same manner and repeated description is omitted.

Figure 3:
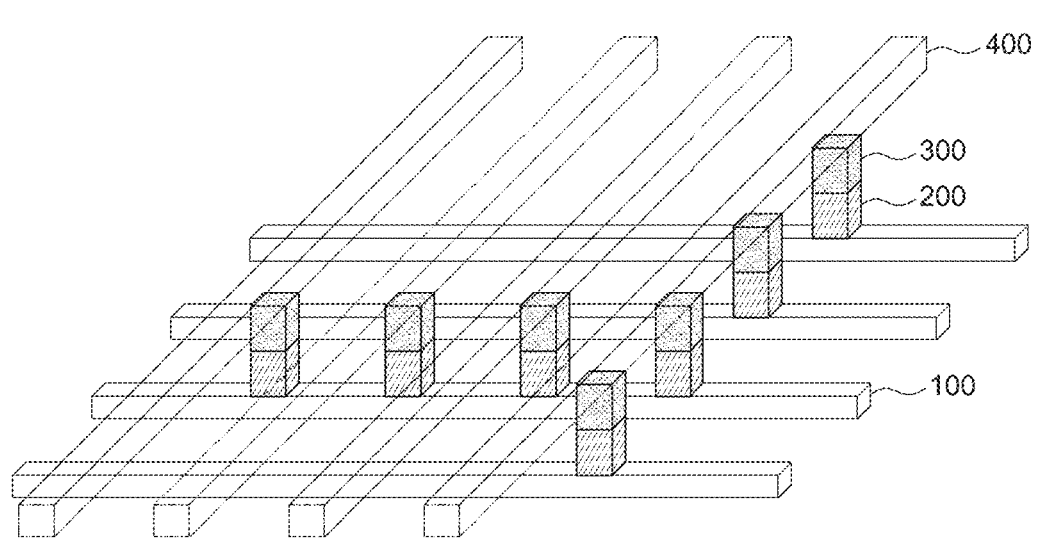
FIG. 3 a perspective view schematically showing a resistive switching memory device array that is an embodiment of the present disclosure.

FIG. 3 a perspective view schematically showing a resistive switching memory device array that is an embodiment of the present disclosure.

Referring to FIG. 3, a resistive switching memory device array that is an embodiment of the present disclosure includes: a first electrode extending in a first direction; a second electrode extending in a second direction crossing the first electrode; and an amorphous metal oxide-based first active layer 200 and an amorphous metal oxide-based second active layer 300 sequentially formed between the first electrode and the second electrode.

In this case, the first active layer 200 and the second active layer 300 may be made of the same substance but different in electrical characteristic.

The amorphous metal oxide-based first active layer 200 and the amorphous metal oxide-based second active layer 300 may include amorphous metal oxide nanoparticles in an amorphous matrix.

In an embodiment of the present disclosure, the amorphous metal oxide is formed between the first electrode and the second electrode, thereby forming a cross point array. As described above, since the resistive switching memory device of the present disclosure has multi-level implementation and storage, a voluntary rectification characteristic, and a voluntary limit current formation characteristic even without an external device, it is possible to form a high-integration cross point array. As a result, it is possible to provide a resistive switching memory device array that has high capacity and can be driven at a high speed.

Experiment Example 1

Experiment of a $Cu_2O$ Crystal Characteristic and an Electrical Characteristic According to an Application Voltage in Electrochemical Deposition This experiment example is described with reference to FIG. 4.

Figure 4:
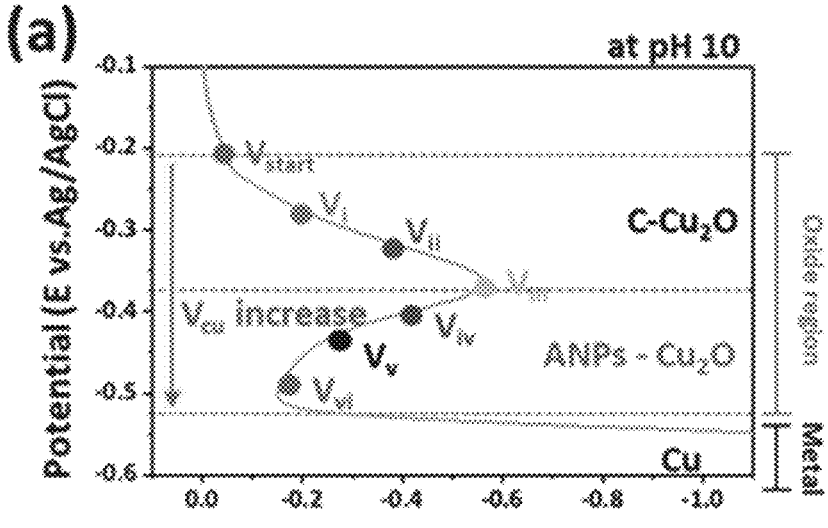
FIG. 4 is (a) a graph showing a voltage region that can electrochemically grow a copper oxide thin film and (b) an X-ray diffraction analysis result of a thin film electrochemically grown at each voltage.
Figure 4:
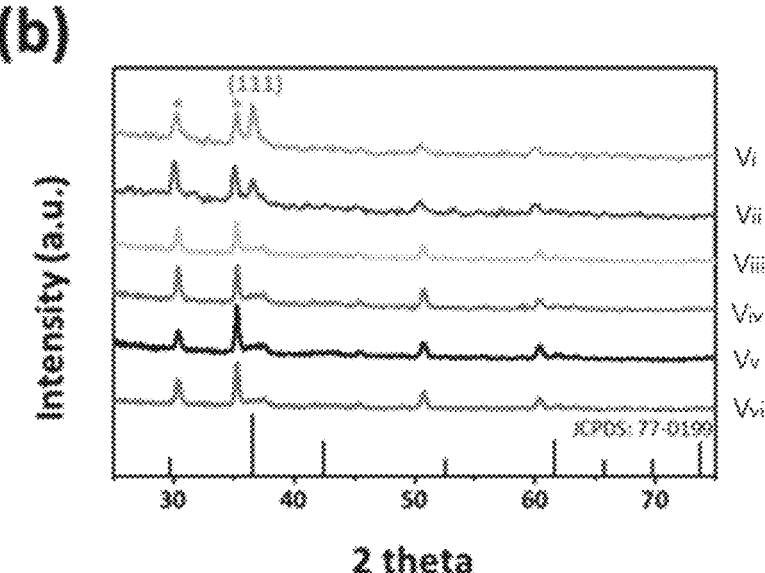

In FIG. 4, (a) is a graph showing a voltage region that can electrochemically grow a copper oxide thin film and (b) is an X-ray diffraction analysis result of a thin film electrochemically grown at each voltage.

This experiment is an experiment of measuring crystallinity and current density of an active layer formed while a voltage was changed from $V_i$ to $V_{vi}$ when forming the active layer using $Cu_2O$ as a metal oxide by electrochemical deposition.

According to (a) of FIG. 4, it can be seen that there are two separate regions of a region (region I) in which a current decreases with an increase of a voltage and a region (region II) in which a current decreases with an increase of a voltage.

Referring to the regions, when an applied voltage is $V_i \sim V_{iii}$ (ED@$V_x$) or less, $Cu_2O$(C—$Cu_2O$) having crystallinity grows and crystallinity gets dense with an increase of a voltage. It is shown that crystalline $Cu_2O$ nanoparticles simultaneously grow in an amorphous $Cu_2O$ matrix at ED@$V_{iii} \sim V_{vi}$ with reference to ED@$V_{iii}$ that is a breakpoint such that as the voltage increases, the $Cu_2O$ nanoparticles get dense and the density increases.

According to (b) of FIG. 4, priority growth direction of a copper oxide ($Cu_2O$) 111 (gray) was observed in ED@$V_i \sim V_{ii}$ thin films, confirming crystallinity, but it can be seen that ED@$V_{iii} \sim Vv_i$ thin films are based on an amorphous structure in which specific crystallinity is not observed.

Accordingly, as proposed by the method of manufacturing a resistive switching memory device that is the present disclosure, it was found that it is possible to change an electrical characteristic even in active layers that were deposited using the same substance by changing a voltage condition.

Further, in order to form an amorphous active layer in which crystalline nanoparticles are distributed on an amorphous active layer using $Cu_2O$ to achieve the effects of the present disclosure, it can be seen that it is required to adjust a voltage condition within the range of $ED@V_{iii}\sim V_{vi}(-0.37V$ to $-0.52V)$, and particularly, it is preferable to configure $V_{iii}$ and $V_{vi}$, which are most greatly different, as the first active layer and the second active layer in order to clearly discriminate a multi-level.

Experiment Example 2

Experiment of Analyzing Electrical Characteristic of Crystalline/Amorphous Active Layers Under Different Voltage Conditions This experiment example is described with reference to FIG. 5.

Figure 5:
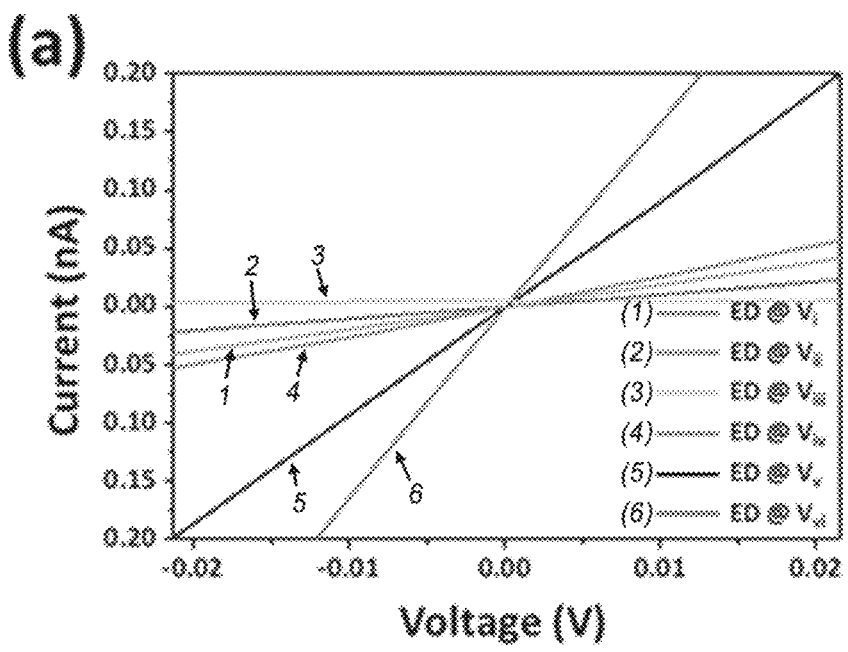
FIG. 5 is (a) a graph showing electrical conductivity of each thin film obtained through linear I-V measurement in the air and (b) the result of measuring charge carrier concentration in a bulk of each thin film through Mott-schottky analysis.
Figure 5:
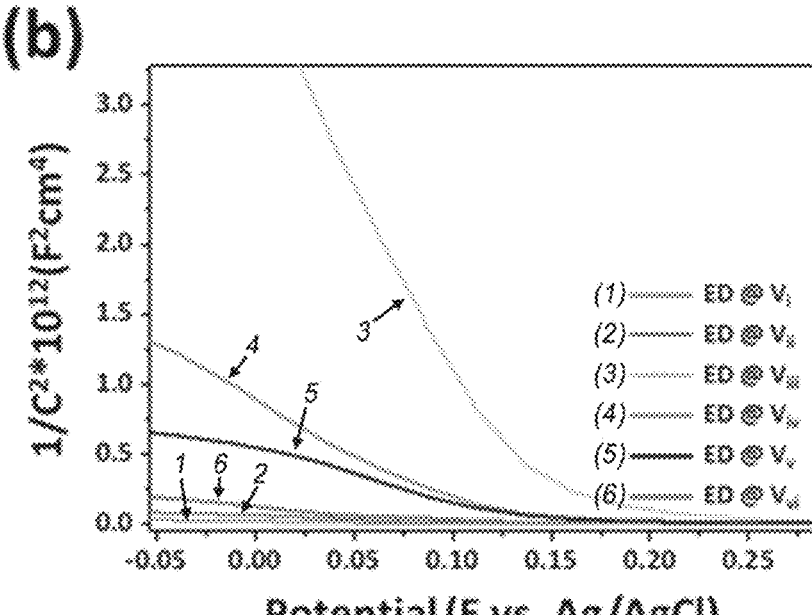

In FIG. 5, (a) is a graph showing electrical conductivity of each thin film obtained through linear I-V measurement in the air, and (b) is the result of measuring charge carrier concentration in a bulk of each thin film through Mott-schottky analysis.

Referring to (a) of FIG. 5, as for crystalline thin films, the higher the voltage of the thin films ($V_i<V_{ii}$), the lower the electrical conductivity during electrochemical growth, and as for amorphous grid-based thin films, the higher the voltage of the thin films ($V_{iii}<V_{iv}<V_v<V_{vi}$), the higher the electrical conductivity during electrochemical growth.

Referring to (b) of FIG. 5, it can be seen that, as for crystalline thin films ($V_i\sim V_{ii}$), the higher the voltage of the thin films ($V_i<V_{ii}$), the more the charge carrier concentration decreased (c decreased and y increased) during electrochemical growth, and as for amorphous grid-based thin films ($V_{iii}\sim V_{vi}$), the higher the voltage of the thin films ($V_{iii}<V_{vi}$), the more the charge carrier concentration increased (c increased and y decreased) during electrochemical growth.

That is, $ED@V_i\sim V_{ii}$ showed that the resistance is higher as the electrochemical growth voltage is higher, and $ED@V_{iii}\sim Vv_i$ showed that the resistance is lower as the electrochemical growth voltage is higher. Accordingly, they show opposite tendencies.

Experiment Example 3

Experiment of Measuring Current Characteristic Over Time During Electrochemical Growth This experiment example is described with reference to FIG. 6.

Figure 6:
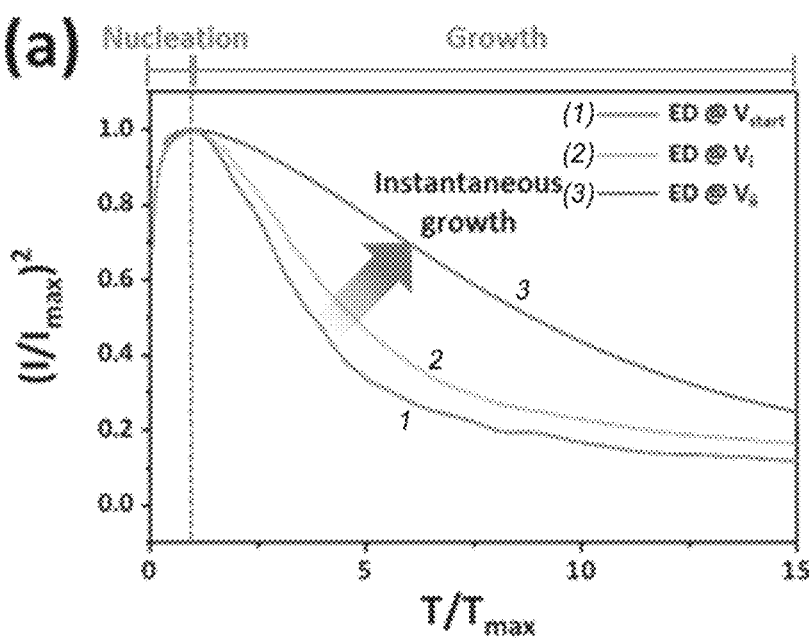
FIG. 6 is (a) a graph showing variation of a current value over time while a crystalline thin film electrochemically grows and (b) a graph showing variation of a current value over time while an amorphous thin film electrochemically grows.
Figure 6:
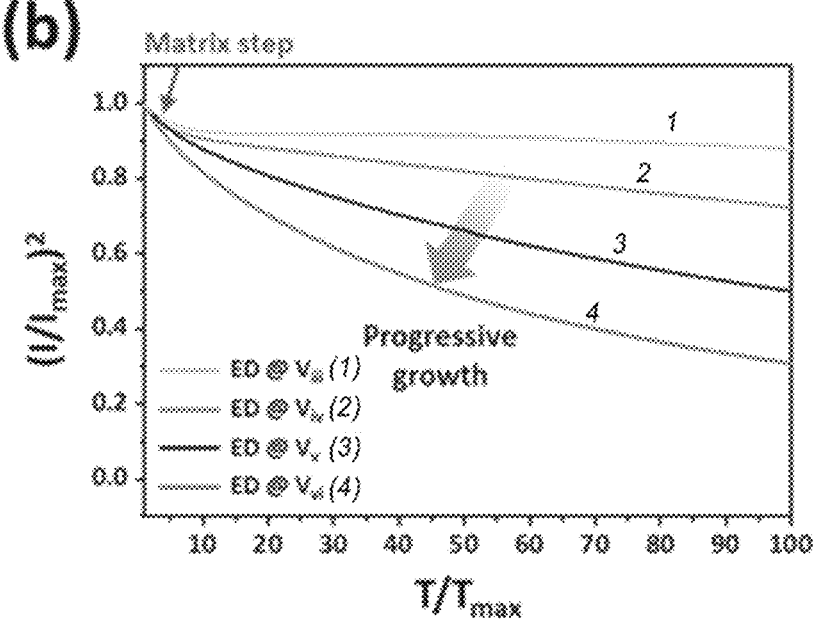

In FIG. 6, (a) is a graph showing variation of a current value over time while a crystalline thin film electrochemically grows, and (b) is a graph showing variation of a current value over time while an amorphous thin film electrochemically grows.

According to FIG. 6, it is possible to discriminate nucleus creation and nucleus growth and determine which is predominant between nucleus creation and nucleus growth.

According to (a) of FIG. 6, a nucleus grew through a nucleation step in $ED@V_i\sim V_{ii}$ thin films. Further, as the deposition voltage increased, nucleus creation simultaneously occurred in accordance with voltage application and an instantaneous growth tendency that immediately occurred was superior.

According to (b) of FIG. 6, $ED@V_{iii}\sim V_{vi}$ thin films were all formed through a process in which a cluster grew without a nucleation step. Further, a progressive growth tendency in which a nucleus continuously grew as the deposition voltage increased was superior.

Experiment Example 4

Experiment of Checking Crystallinity of Thin Film Under Different Voltage Condition for Electrochemical Growth This experiment example is described with reference to FIG. 7.

Figure 7:
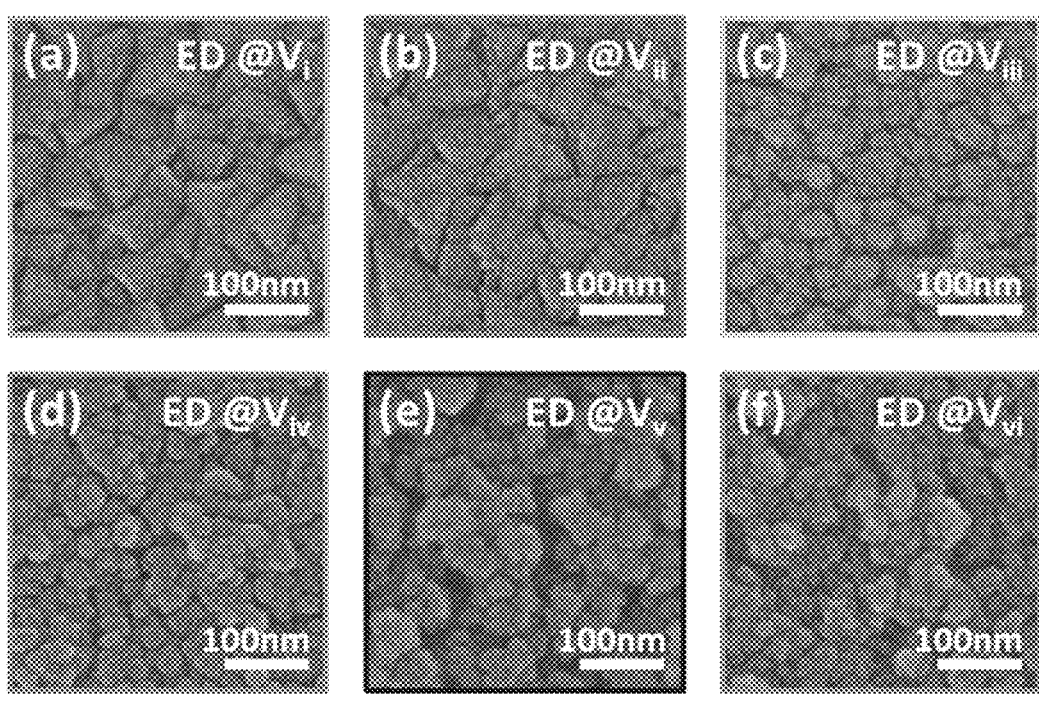
FIG. 7 is an SEM image of thin films under different voltage conditions for electrochemical growth.

FIG. 7 is an SEM image of thin films under different voltage conditions for electrochemical growth.

According to (a) of FIG. 7, a triangular pyramidal shape that is a structural characteristic of a Cu2O surface that preferentially grew in a direction 111 was observed in $ED@V_i\sim V_{ii}$ thin films, so a crystalline structure was found.

According to (b) of FIG. 7, it could be seen that round nanoparticles were uniformly distributed in an amorphous matrix of $ED@V_{iii}\sim V_{vi}$ thin films. As for each voltage, it could be seen that as a voltage applied for growth of each thin film increased, the average size of nanoparticles decreased, but the density increased, so a large amount of crystalline metal oxide nanoparticles ware formed in an amorphous structure.

Experiment Example 5

Experiment of Measuring Resistance Variation of Resistive Switching Memory Device This experiment example is described with reference to FIG. 8.

Figure 8:
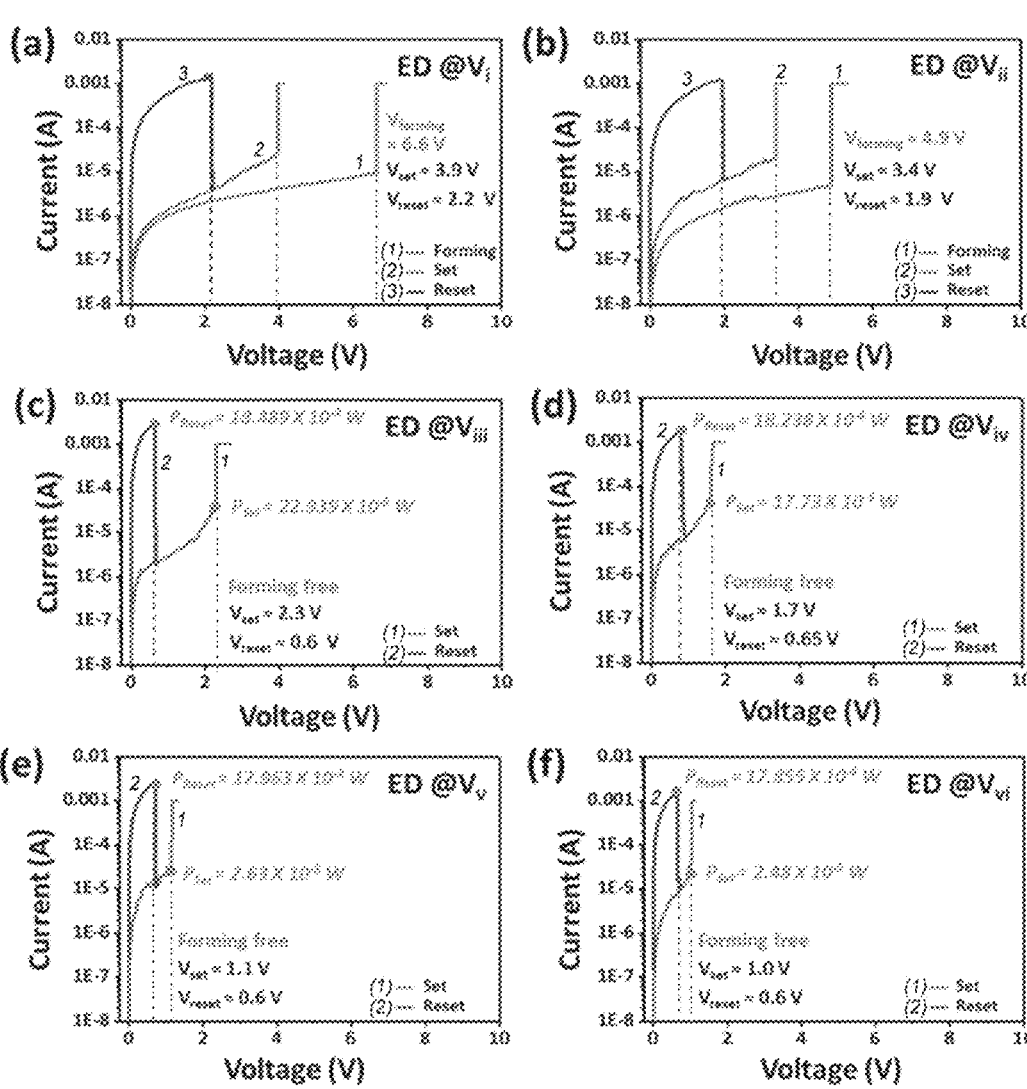
FIG. 8 shows data obtained by analyzing a resistance variation characteristic of resistive switching memory devices, which have thin films under different voltage conditions for electrochemical growth as active layers, through I-V measurement.

FIG. 8 shows data obtained by analyzing a resistance variation characteristic of a resistive switching memory device, which has thin films under different voltage conditions for electrochemical growth as active layers, through I-V measurement.

Referring to FIG. 8, a unipolar driving type was shown in all cases.

Referring to (a) and (b) of FIG. 8, it was found that since $ED@V_i\sim V_{ii}$ has non-uniform grain boundary density according to a crystalline structure, the memory device showed irregular forming and set driving.

According to (c) to (f) of FIG. 8, it was found that since the entire thin film has a uniform structural characteristic on the basis of an amorphous grid in $ED@V_{iii}\sim V_{vi}$, the memory device showed a forming-free characteristic and regular set driving.

Further, it can be seen that since the higher the thin film deposition voltage, the higher the charge carrier concentration and the electrical conductivity in $ED@V_{iii}\sim V_{vi}$, a small amount of energy is required for set driving, so it is driven in a low voltage region.

Experiment Example 6

Experiment of Measuring LRS and HRS Behavior of Amorphous Thin Films Under Different Voltage Condition for Electrochemical Growth This experiment example is described with reference to FIG. 9.

Figure 9:
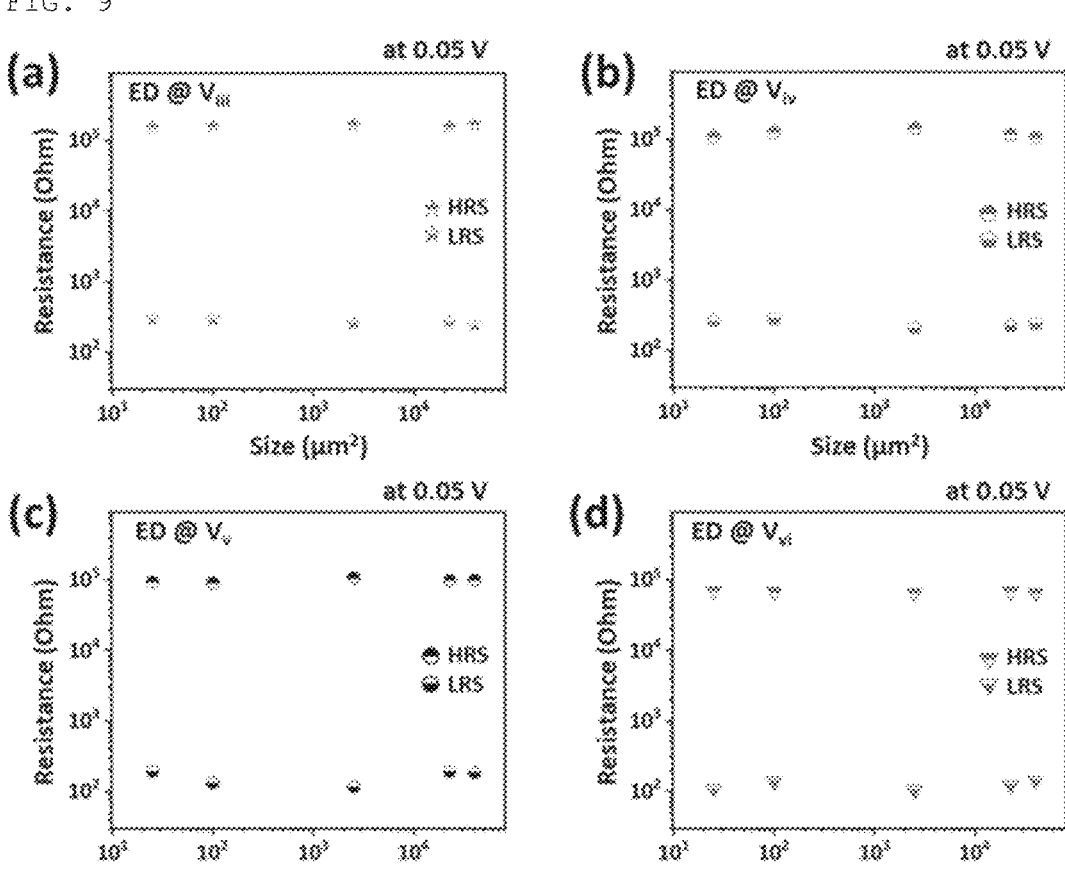
FIG. 9 is the result of measuring LRS and HRS behaviors to specify resistance variation types of amorphous thin films under different voltage conditions for electrochemical growth.

FIG. 9 is the result of measuring LRS and HRS behaviors to specify resistance variation types of amorphous thin films under different voltage conditions for electrochemical growth.

In this experiment, resistance values of an LRS and HRS according to electrode sizes from 25 $\mu m^2$ and 40000 $\mu m^2$ were measured in order to specify a resistance variation type of $ED@V_{iii}\sim V_{vi}$ thin films. In this case, if a resistance value is affected by an electrode size, it is an interface resistance variation type, and if not so, it is a filament resistance variation type.

According to FIG. 9, it was found that the devices described above were not greatly affected by the size of an electrode, so they were all filament resistance variation types.

Experiment Example 7

Experiment of Checking Multi-Level Characteristic, Voluntary Rectification Characteristic, and Voluntary Limit Current Characteristic of Resistive Switching Memory Device This experiment example is described with reference to FIG. 10.

Figure 10:
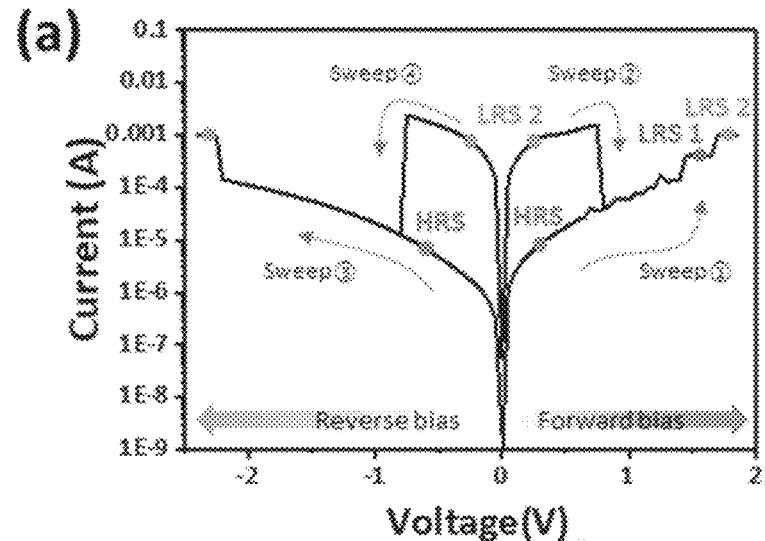
FIG. 10 shows data obtained by measuring a multi-level characteristic, a voluntary rectification characteristic, and a voluntary limit current characteristic of a resistive switching memory device that is an embodiment of the present disclosure.
Figure 10:
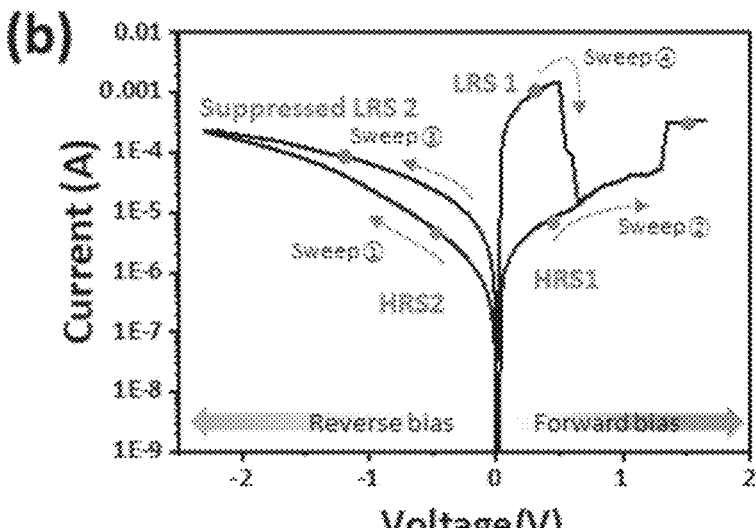

FIG. 10 shows data obtained by measuring a multi-level characteristic, a voluntary rectification characteristic, and a voluntary limit current characteristic of a resistive switching memory device that is an embodiment of the present disclosure.

In this experiment, a stacked active layer was configured by selecting an $ED@V_{iii}$ thin film and an $ED@V_{vi}$ thin film. In detail, an $ED@V_{iii}$ thin film was stacked on an ITO substrate and then an $ED@V_{vi}$ thin film was sequentially stacked. Thereafter, a Pt upper electrode was deposited.

The two thin films both have the same structural characteristic, forming-free characteristic, and filament resistance variation characteristic on the basis of an amorphous grid, but they are different in set driving voltage due to a difference of an electrical characteristic.

According to (a) of FIG. 10, when IV sweep was measured at a forward bias until a compliance current value limited at 1 mA was reached, set driving occurred and then reset driving occurred in the forward direction, so unipolar resistance variation was shown. It was found that set driving and reset driving were shown later at a backward bias as well. However, it was found that the set driving that occurred at the forward bias occurred through two steps, and confirming that this device had a multi-level storage function that voluntarily stores an LRS1 state and an LRS2 state.

According to (b) of FIG. 10, it is a graph obtained by measuring IV sweep at a forward bias until a current value corresponding to the LRS1 shown in (a) of FIG. 10 was reached, and it was found that it had a voluntary compliance current limit function by suppressing a current by itself up to a predetermined voltage after the LRS1 state was reached. It was found that it performed again unipolar resistance variation driving by performing reset driving at a forward bias. However, it was found that it showed a high resistance value at a backward bias in both the LRS1 state and the HRS state and had a voluntary current rectification function.

That is, in FIG. 10, (a) shows that a dual active layer device can secure high memory density through a multi-level storage function and (b) shows that the device can be independently driven without an external device in the level of an array because it has a voluntary compliance current limit function and a voluntary current rectification function.

Experiment Example 8

Experiment of Measuring Resistance of 4×4 Cross Array

This experiment example is described with reference to FIG. 11.

Figure 11:
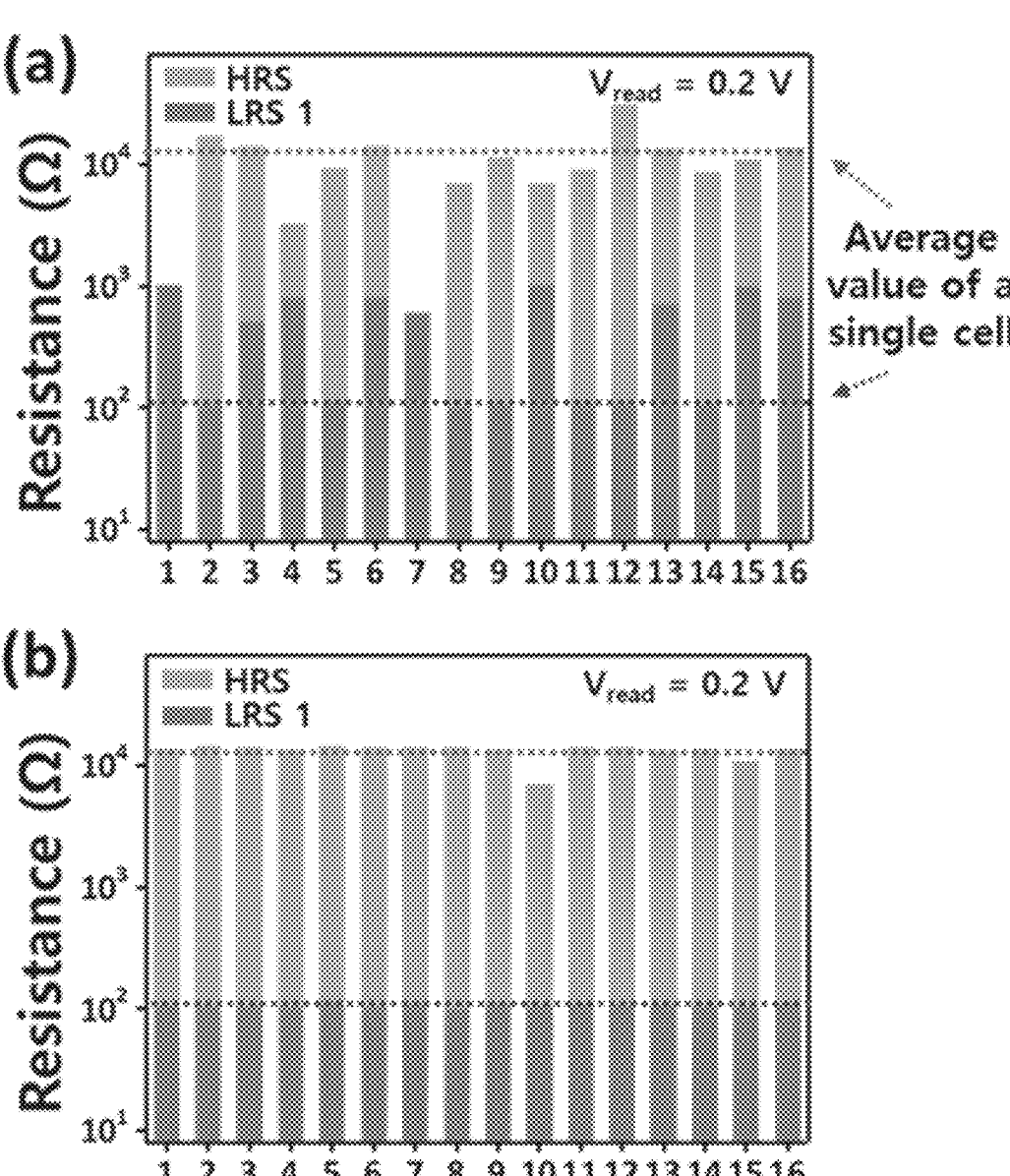
FIG. 11 is (a) the result of measuring resistance of a 4×4 cross array configured by a single-structure active layer and (b) the result of measuring resistance when a resistive switching memory device memory that is an embodiment of the present disclosure is manufactured into 4×4.

In FIG. 11, (a) is the result of measuring resistance of a 4×4 cross array configured by a single-structure active layer, and (b) is the result of measuring resistance when a resistive switching memory device array that is an embodiment of the present disclosure is manufactured into 4×4.

In this experiment, a 4×4 crossbar array was configured, an LRS or HRS state was stored individually for sixteen devices, and then a resistance value of each of the devices was measured using a line electrode of the array in order to check whether a dual active resistive switching memory device device can be individually driven and can transmit accurate data in the level of an array.

In FIG. 11, (a) is the result of measuring resistance of a 4×4 crossbar array configured as a single active layer, and (b) is the result of measuring a resistance value of a 4×4 crossbar array configured as a dual active layer. Each resistance value was compared with an average resistance value in an LRS and an HRS of a signal device.

According to (a) of FIG. 11, it was found that sixteen devices each showed a large difference from the average resistance value of a single device in a single active layer-based array, and inaccurate data were transmitted.

According to (b) of FIG. 11, it was found that sixteen devices each did not show a large difference from the average resistance value of a single device in a dual active layer-based array, and accurate data were transmitted.

According to the result, since the dual active layer resistive switching memory device device of the present disclosure has a voluntary compliance current limit function and a voluntary current rectification function, so the device can transmit accurate information without help of an external device even in the level of an array.

The present disclosure having the above configuration has an effect that since active layers are formed in dual amorphous layers made of the same material, it is possible to resolve the problem of adjustment of grain boundaries and non-uniformity and instability of a device due to the problem, whereby it is possible to produce a resistive switching memory device that has a controllable stable electrical characteristic and a large area.

Further, according to the configuration, since a forming voltage is not formed between active layers and the driving voltages and the filament mechanisms are the same, it is possible to provide a voluntary compliance current limit and voluntary current rectification characteristics through a single device without help of external device.

As a result, it is possible to implement a memory, which is driven with only an active layer characteristic without help of external device, as a nonvolatile super high-speed memory, integration of the memory is greatly improved, and the problem of cross talk is solved without help of an external device when an array is formed, whereby it is possible to implement a memory that provides accurate information without an error in data.

Further, since different electrical characteristics are implemented by applying different voltage conditions when depositing the dual active layers by electrochemical deposition, a resistive switching memory device that can be driven at a multi-level is provided. As a result, it is possible to considerably increase the capacity of a memory while maintaining high integration and super high driving characteristics.

The effects of the present invention are not limited thereto and it should be understood that the effects include all effects that can be inferred from the configuration of the present disclosure described in the following specification or claims.

The above description is provided as an exemplary embodiment of the present disclosure and it should be understood that the present disclosure may be easily modified in other various ways without changing the spirit or the necessary features of the present disclosure by those skilled in the art. Therefore, the embodiments described above are only examples and should not be construed as being limitative in all respects. For example, the components described as single parts may be divided and the components described as separate parts may be integrated.

The scope of the present disclosure is defined by the following claims, and all of changes and modifications obtained from the meaning and range of claims and equivalent concepts should be construed as being included in the scope of the present disclosure.

What is claimed is:

1. A resistive switching memory device comprising:
a lower electrode;
an amorphous metal oxide-based first active layer positioned on the lower electrode;
an amorphous metal oxide-based second active layer positioned on the first active layer; and
an upper electrode positioned on the second active layer,
wherein the first active layer and the second active layer are made of the same substance but are different in electrical characteristic and
wherein the resistive switching memory device has:
(a) a first resistance state in which a first positive voltage is applied between the upper electrode and the lower electrode so the first active layer is set into a low-resistance state;
(b) a second resistance state in which a second positive voltage is applied between the upper electrode and the lower electrode so the first active layer and the second active layer are set into a low-resistance state; and
(c) a third resistance state in which a third positive voltage is applied between the upper electrode and the lower electrode so the first active layer and the second active layer are reset into a high-resistance state.

2. The resistive switching memory device of claim 1, wherein the amorphous metal oxide-based first active layer includes crystalline metal oxide nanoparticles.

3. The resistive switching memory device of claim 1, wherein the amorphous metal oxide-based second active layer includes crystalline metal oxide nanoparticles.

4. The resistive switching memory device of claim 1, wherein the first active layer and the second active layer are the same in reset driving voltage.

5. The resistive switching memory device of claim 1, wherein the first active layer or the second active layer has a voluntary rectification characteristic.

6. The resistive switching memory device of claim 1, wherein the first active layer and the second active layer include one or more selected from a group composed of $CuO$, $Cu_2O$, $Al_2O_3$, $Nb_2O$, $NiO$, $MgO$, $TiO_2$, $ZrO_2$, $Nb:SrTiO_3$, $Cr:SrTiO_3$, $Cr:SrZrO_3$, $ZnO$, $Co_3O_4$, $Fe_2O_3$, $Ag_2O_3$, $Bi_2O_3$, $Sb_2O_3$, $PbO_2$, $RuO_2$, $MnO_2$, $Cr_2O_3$, and a combination thereof.

7. A resistive switching memory device array comprising:
a first electrode extending in a first direction;
a second electrode extending in a second direction crossing the first electrode; and
an amorphous metal oxide-based first active layer and an amorphous metal oxide-based second active layer sequentially formed between the first electrode and the second electrode,
wherein the first active layer and the second active layer are made of the same substance and are different in electrical characteristic and
wherein the first active layer and the second active layer are different in set driving voltage.

8. The resistive switching memory device array of claim 7, wherein the amorphous metal oxide-based first active layer includes crystalline metal oxide nanoparticles.

9. The resistive switching memory device array of claim 7, wherein the amorphous metal oxide-based second active layer includes crystalline metal oxide nanoparticles.

10. The resistive switching memory device array of claim 7, wherein the first active layer and the second active layer include one or more selected from a group composed of $CuO$, $Cu_2O$, $Al_2O_3$, $Nb_2O$, $NiO$, $MgO$, $TiO_2$, $ZrO_2$, $Nb:SrTiO_3$, $Cr:SrTiO_3$, $Cr:SrZrO_3$, $ZnO$, $Co_3O_4$, $Fe_2O_3$, $Ag_2O_3$, $Bi_2O_3$, $Sb_2O_3$, $PbO_2$, $RuO_2$, $MnO_2$, $Cr_2O_3$, and a combination thereof.

* * * * *